(12) United States Patent
Cirkic

(10) Patent No.: US 10,651,873 B2
(45) Date of Patent: May 12, 2020

(54) POLAR CODE SUCCESSIVE CANCELLATION LIST DECODING

(71) Applicant: Telefonaktiebolaget LM Ericsson (publ), Stockholm (SE)

(72) Inventor: Mirsad Cirkic, Linköping (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 22 days.

(21) Appl. No.: 16/095,492

(22) PCT Filed: Apr. 29, 2016

(86) PCT No.: PCT/EP2016/059656
§ 371 (c)(1),
(2) Date: Oct. 22, 2018

(87) PCT Pub. No.: WO2017/186307
PCT Pub. Date: Nov. 2, 2017

(65) Prior Publication Data
US 2019/0132009 A1 May 2, 2019

(51) Int. Cl.
*H03M 13/00* (2006.01)
*H03M 13/37* (2006.01)
*H03M 13/13* (2006.01)
*H03M 13/39* (2006.01)

(52) U.S. Cl.
CPC ........... *H03M 13/37* (2013.01); *H03M 13/13* (2013.01); *H03M 13/3746* (2013.01); *H03M 13/3905* (2013.01); *H03M 13/3977* (2013.01)

(58) Field of Classification Search
CPC .... H03M 13/37; H03M 13/13; H03M 13/015; H03M 13/251; H03M 13/3746; H03M 13/39; H03M 13/3905; H03M 13/3977
USPC ........ 714/776, 780, 781, 752, 753, 755, 758
See application file for complete search history.

(56) References Cited

U.S. PATENT DOCUMENTS

| | | |
|---|---|---|
| 2015/0026543 A1 | 1/2015 | Li et al. |
| 2015/0263767 A1 | 9/2015 | Shin et al. |
| 2016/0013810 A1* | 1/2016 | Gross .................... H03M 13/09 714/776 |
| 2019/0296857 A1* | 9/2019 | Gritsenko ......... H03M 13/6368 |
| 2019/0372604 A1* | 12/2019 | Li ............................. H04L 1/00 |

OTHER PUBLICATIONS

Zhang, Z., et al., "A Split-Reduced Successive Cancellation List Decoder for Polar Codes", IEEE Journal on Selected Areas in Communications, vol. 34, No. 2, Feb. 1, 2016, pp. 292-302.
(Continued)

*Primary Examiner* — Christine T. Tu
(74) *Attorney, Agent, or Firm* — Sage Patent Group (57) ABSTRACT

A method is performed by an information decoder. The method comprises obtaining (S102) an encoded sequence having been encoded using a polar code. The method comprises successively decoding (S104) the encoded sequence into the successive bits of the decoded sequence. Successively decoding the encoded sequence comprises performing a threshold check (S106) for evaluating a bit uncertainty criterion. Successively decoding the encoded sequence comprises branching (S108) the decoded sequence into two candidate decoded sequences whenever the threshold check fails.

20 Claims, 7 Drawing Sheets

(56) References Cited

OTHER PUBLICATIONS

Cao, C., "Low Complexity list successive cancellation decoding of polar codes", IET Communications, Received Mar. 5, 2014, accepted Jul. 28, 2014, pp. 3145-3149, The Institution of Engineering and Technology.

Tal, I., et al., "List Decoding of Polar Codes", May 31, 2012, pp. 1-11, Retrieved on Oct. 22, 2018, retrieved from Internet: https://arxiv.org/pdf/1206.0050.pdf?, arXiv:1206.0050v1, Cornell University Library.

Ankan, E., "Channel polarization: A method for constructing capacity-achieving codes for symmetric binary-input memoryless channels", Jul. 20, 2009, pp. 1-23, retrieved on Oct. 22, 2018, retrieved from internet: https://arxiv.org/pdf/0807.3917.pdf, arXiv:0807.3917v5, Cornell University Library.

* cited by examiner

POLAR CODE SUCCESSIVE CANCELLATION LIST DECODING

TECHNICAL FIELD

Embodiments presented herein relate to a method, an information decoder, a computer program, and a computer program product for decoding an encoded sequence into a decoded sequence.

BACKGROUND

In communications networks, there may be a challenge to obtain good performance and capacity for a given communications protocol, its parameters and the physical environment in which the communications network is deployed.

For example, in digital communication the data to be communicated from a sender to a receiver can be divided into smaller data segments which are sent in packets. These data segments are provided with information of how the data protocol used for transferring the data from the sender to the receiver should map the packets and, in some cases, analyze if the data content of the packet is correct or not. This information can typically be predicted or known by the receiver. For example when using the Internet Protocol (IP), IP-packet headers are needed for each device along the way from the sender to the receiver to route the packet. In some communications networks, such as in Long Term Evolution (LTE) radio access networks, a served wireless device will typically never receive an IP-packet with the wrong IP-address (which is exploited by so-called header-compression).

Polar codes, as presented in "Channel polarization: A method for constructing capacity-achieving codes for symmetric binary-input memoryless channels," IEEE Trans. Inform. Theory, vol. 55, pp. 3051-3073, 2009, are capacity achieving codes, have an explicit construction (i.e., not randomly generated), and have an efficient encoding and decoding algorithm. Apart from the capacity achieving property, which is valid when code-lengths tend to infinity, they have shown good performance for shorter code-lengths.

Figure 2:
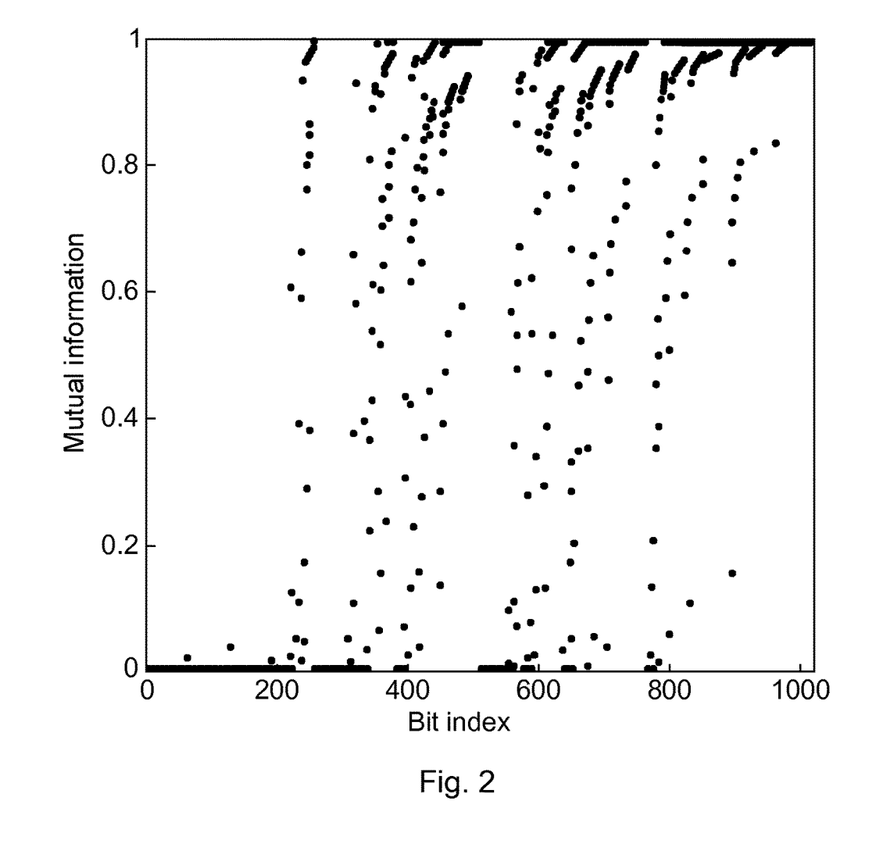
FIG. 2 is a schematic diagram illustrating mutual information according to an embodiment.

One issue with existing mechanisms for decoding polar codes lies in the successive decoding (SD) procedure which follows the bit-order of the polar codes. Decoding of polar codes is prone to error propagation and hence, an error made early in the successive decoding procedure will not be corrected, but will instead propagate all the way to the end of the decoding. This will result in a decoding error. Additionally it is more likely to make an error early in the procedure than at the end, see FIG. 2. FIG. 2 shows an example of the amount of information for a bit with index i (for i=1, 2, . . . N where N is the total number of binary digits, and N=1024 in the example) can carry, given that all the previous binary digits 1, 2, . . . , i−1 are known, i.e., where the polar code decoding order is followed.

According to US2015/0026543 A1, this problem is mitigated by expanding a fixed list of binary digits (indices) that are most likely to be erroneous. However, this list is not dependent on the instantaneous channel realization but rather on the channel distribution and therefore will be mismatched in some cases. According to "List decoding of polar codes" by I. Tal and A Vardy, arXiv: 1206.0050, 31 May 2012, a procedure that splits the paths in the binary tree is proposed. The technique keeps track of the most probable paths currently known and disregards the rest. However, the probability measures are not exact and if the measured (evaluated) probability values are close to each other (but still not same and therefore orderable) may result in picking wrong paths due to the errors in the probabilities.

Hence, there is still a need for improved mechanisms for decoding data having been encoded using polar codes.

SUMMARY

An object of embodiments herein is to provide efficient decoding of polar codes.

According to a first aspect there is presented a method for decoding an encoded sequence into a decoded sequence. The method is performed by an information decoder. The method comprises obtaining the encoded sequence, the encoded sequence having been encoded using a polar code. The method comprises successively decoding the encoded sequence into the decoded sequence. Successively decoding the encoded sequence comprises performing a threshold check of at least some successive binary digits in a sequence of the encoded sequence that is being decoded, the threshold check evaluating a bit uncertainty criterion of these at least some successive binary digits. Successively decoding the encoded sequence comprises branching the decoded sequence into two candidate decoded sequences whenever the threshold check fails.

Advantageously this provides efficient decoding of a sequence having been encoded using a polar code into a decoded sequence.

Advantageously this method improves the accuracy (defined by the probability of decoding a code word correctly) whilst also reducing the complexity (defined by the number of elementary operations) of the information decoder. The disclosed method improves the accuracy with respect to the aforementioned paper "Channel polarization: A method for constructing capacity-achieving codes for symmetric binary-input memoryless channels" and both the complexity and the accuracy with respect to aforementioned US2015/0026543 A1.

Advantageously this method improves the decoding performance using the decoding order of the polar code structure. In essence, it is more likely to branch the binary digits (that are not fixed) that have intermediate index numbers that are close to the lower indices. In polar codes, the binary digits with low indices are more uncertain, i.e., those which have smaller mutual information (can be treated as an average certainty measure over the channel distribution), than those with high indices. Many binary digits that have low indices are a priori fixed in the design of the polar code, but not all. These binary digits which are not fixed are binary digits of intermediate indices that are on average not clearly uncertain, but from channel realization to channel realization might be. The proposed method will, based on the instantaneous bit-uncertainty, branch any binary digits that are identified as uncertain and that have not been a priori fixed during the code design.

According to a second aspect there is presented an information decoder for decoding an encoded sequence into a decoded sequence. The information decoder comprises processing circuitry. The processing circuitry is configured to cause the information decoder to obtain the encoded sequence, the encoded sequence having been encoded using a polar code. The processing circuitry is configured to cause the information decoder to successively decode the encoded sequence into the decoded sequence. The processing circuitry is configured to cause the information decoder to perform a threshold check of at least some successive binary digits in a sequence of the encoded sequence that is being decoded, the threshold check evaluating a bit uncertainty criterion of these at least some successive binary digits. The processing circuitry is configured to cause the information decoder branch the decoded sequence into two candidate decoded sequences whenever the threshold check fails.

From a hardware implementation perspective, once the binary digits are branched, which will most often happen early in the decoding procedure (for binary digits in the encoded sequence with smaller bit-indices), the different decoding instances (i.e., the decoding of the different candidate decoded sequences) can run in parallel not to delay the parallel probability evaluations of the binary digits of the different decoding instances. This stands in contrast to the aforementioned paper "List decoding of polar codes", where a comparison between the currently evaluated paths will need to be performed each time the list is pruned.

According to a third aspect there is presented an information decoder for decoding an encoded sequence into a decoded sequence. The information decoder comprises processing circuitry and a computer program product. The computer program stores instructions that, when executed by the processing circuitry, causes the information decoder to perform steps, or operations. The steps, or operations, cause the information decoder to obtain the encoded sequence, the encoded sequence having been encoded using a polar code. The steps, or operations, cause the information decoder to successively decode the encoded sequence into the decoded sequence. The steps, or operations, cause the information decoder to perform a threshold check of at least some successive binary digits in a sequence of the encoded sequence that is being decoded, these threshold check evaluating a bit uncertainty criterion of these at least some successive binary digits. The steps, or operations, cause the information decoder to branch the decoded sequence into two candidate decoded sequences whenever the threshold check fails.

According to a fourth aspect there is presented an information decoder for decoding an encoded sequence into a decoded sequence. The information decoder comprises an obtain module configured to obtain the encoded sequence, the encoded sequence having been encoded using a polar code. The information decoder comprises a decode module configured to successively decode the encoded sequence into the decoded sequence. The information decoder comprises a check module configured to perform a threshold check of at least some successive binary digits in a sequence of the encoded sequence that is being decoded, the threshold check evaluating a bit uncertainty criterion of these at least some successive binary digits. The information decoder comprises a branch module configured to branch the decoded sequence into two candidate decoded sequences whenever the threshold check fails.

According to a fifth aspect there is presented a computer program for decoding an encoded sequence into a decoded sequence, the computer program comprising computer program code which, when run on an information decoder, causes the information decoder to perform a method according to the first aspect.

According to a sixth aspect there is presented a computer program product comprising a computer program according to the fifth aspect and a computer readable storage medium on which the computer program is stored.

It is to be noted that any feature of the first, second, third, fourth, fifth and sixth aspects may be applied to any other aspect, wherever appropriate. Likewise, any advantage of the first aspect may equally apply to the second, third, fourth, fifth and/or sixth aspect, respectively, and vice versa. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

Figure 1:
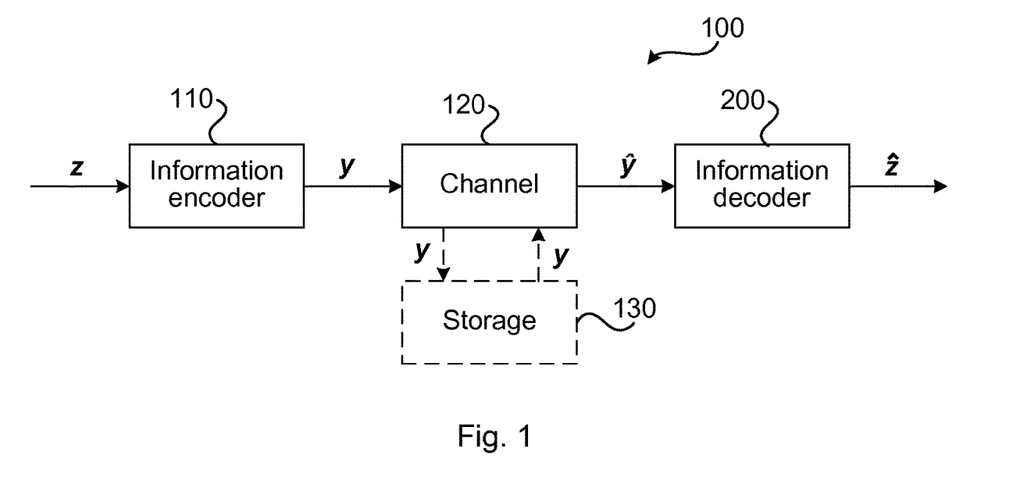
FIG. 1 is a schematic diagram illustrating a communication network according to an embodiment.

FIG. 1 is a schematic diagram illustrating a communications network 100 where embodiments presented herein can be applied. The communications network 100 comprises an information encoder 110 and an information decoder 200. The information encoder 110 is configured to encode an information sequence $z=z_1, z_2, z_3, \ldots, z_N$ into an encoded sequence y. The information decoder 200 is configured to decode an encoded sequence $\hat{y}$ into a decoded sequence $\hat{z}$.

The information encoder 110 and the information decoder 200 are separated by a symbolic communications channel 120. The communications channel 120 models how the encoded sequence y is affected between the information encoder 110 and the information decoder 200. For example, the transmission of the encoded sequence y may cause errors to be inserted in the encoded sequence y. Here, and error is to be interpreted as a bit-value in the encoded sequence y being flipped from a binary zero to a binary one, or vice versa, during transmission over the communications channel 120. Therefore the encoded sequence y as obtained by the information decoder 200 is denoted $\hat{y}$, where $\hat{y}=y$ if the channel is error-free and $\hat{y} \neq y$ elsewhere. Further, if $\hat{y}=y$ then also $\hat{z}=z$, but if $\hat{y} \neq y$ there is a non-zero probability that $\hat{z} \neq z$. In order to minimize the probability that $\hat{z} \neq z$ the information encoder 110 during the encoding procedure adds redundancy to the information sequence z in a controlled manner, resulting in the encoded sequence y. The redundancy is added in the controlled manner by using a polar code. Conversely, at the information decoder 200 the added redundancy is removed from the received encoded sequence $\hat{y}$ in a controlled manner, resulting in the decoded sequence $\hat{z}$. Further, the communications network 100 comprises a (optional) data storage 130. The data storage 130 is assumed to store data losslessly, i.e., without introducing losses in the stored data. Any losses in the data are modeled by the communications channel 120.

The information encoder 110 and the information decoder 200 use a polar code to protect the information sequence z against channel distortions. The information encoder 110 will encode the information sequence z using a predetermined polar code into the encoded sequence y which will then be used in a transmission over the communications channel 120. The received encoded sequence $\hat{y}$, which, as disclosed above, can be distorted when passing through the communications channel 120, will be decoded by the information decoder 200 using a polar code successive decoder.

Figure 3:
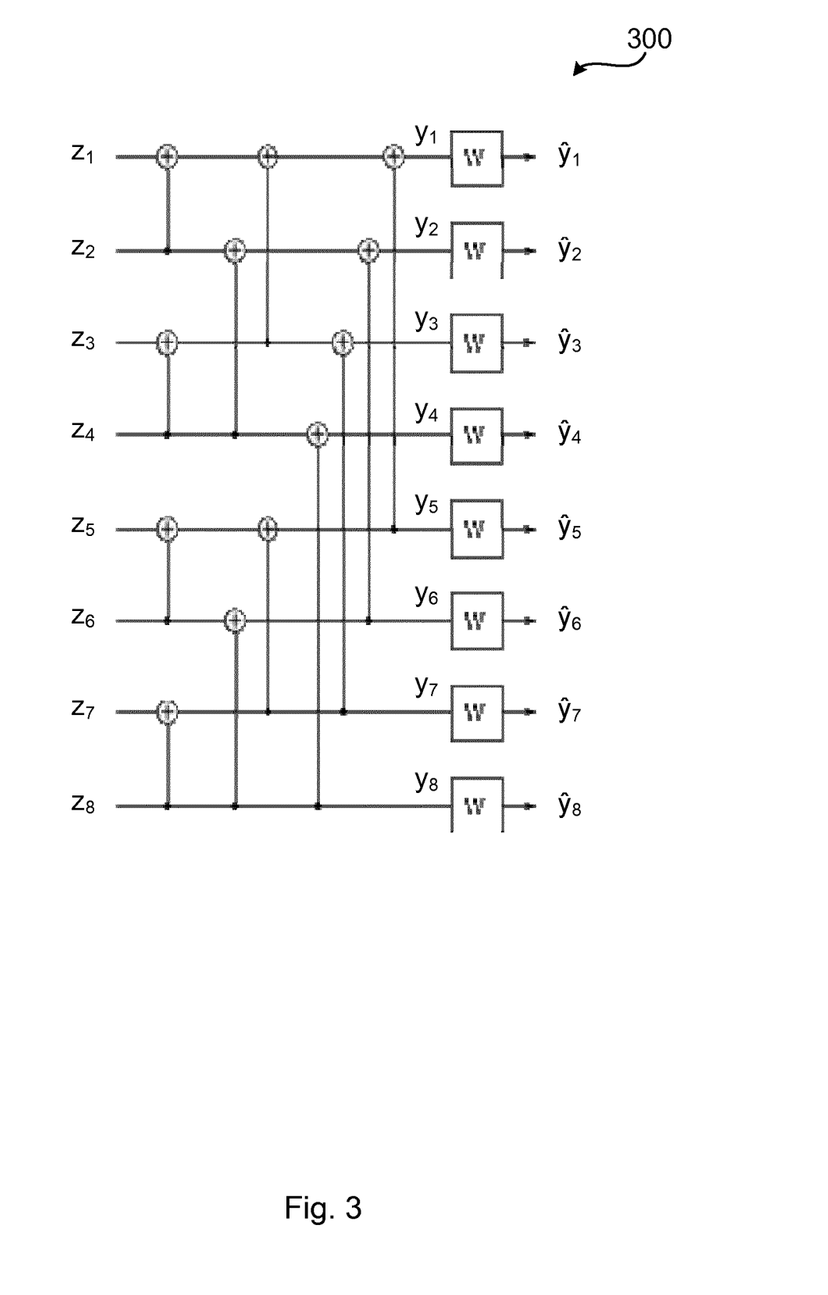
FIG. 3 is a schematic diagram illustrating a polar code.

FIG. 3 is a schematic diagram illustrating a polar code 300, where w represents the communications channel 120. In the example of FIG. 3, some of $z_1, z_2, z_3, \ldots, z_N$ represents information bits and the rest of $z_1, z_2, z_3, \ldots, z_N$ represents added redundancy bits (having fixed, and thus known, values). Using the polar code example in FIG. 3, the information decoder 200, based on the received encoded sequence $\hat{y}$, estimates the probabilities of the encoded sequence y and then propagates these backwards throughout the polar code structure to calculate the probabilities of the information sequence z. The decision made on $z_1$ based on the calculated probability is propagated downwards when the probabilities of $z_2, z_3, \ldots, z_N$ are evaluated. The same is repeated for $z_2$ and so on, which defines the underlying successive decoding procedure. The better the information decoder 200 is, i.e., the more errors in the received encoded sequence $\hat{y}$ it can correct, the more information can be conveyed over the communication channel w.

The embodiments disclosed herein relate to decoding an encoded sequence $\hat{y}$ into a decoded sequence $\hat{z}$, where the encoded sequence $\hat{y}$ has been encoded using a polar code. In order to obtain such mechanism there is provided a information decoder 200, a method performed by the information decoder 200, a computer program product comprising code, for example in the form of a computer program, that when run on a information decoder 200, causes the information decoder 200 to perform the method.

Figures 4, 5:
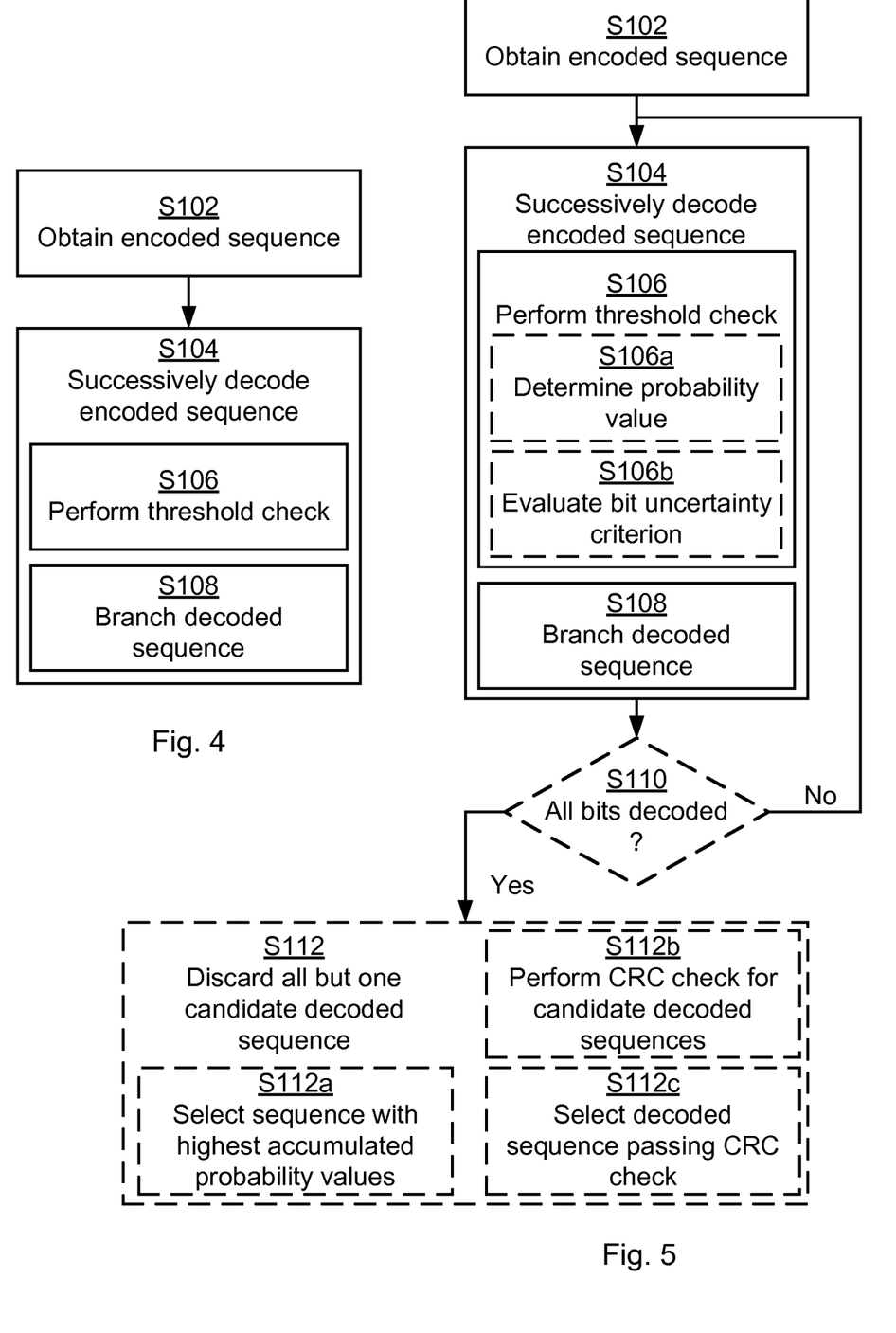
FIGS. 4, 5, and 6 are flowcharts of methods according to embodiments.
Figure 6:
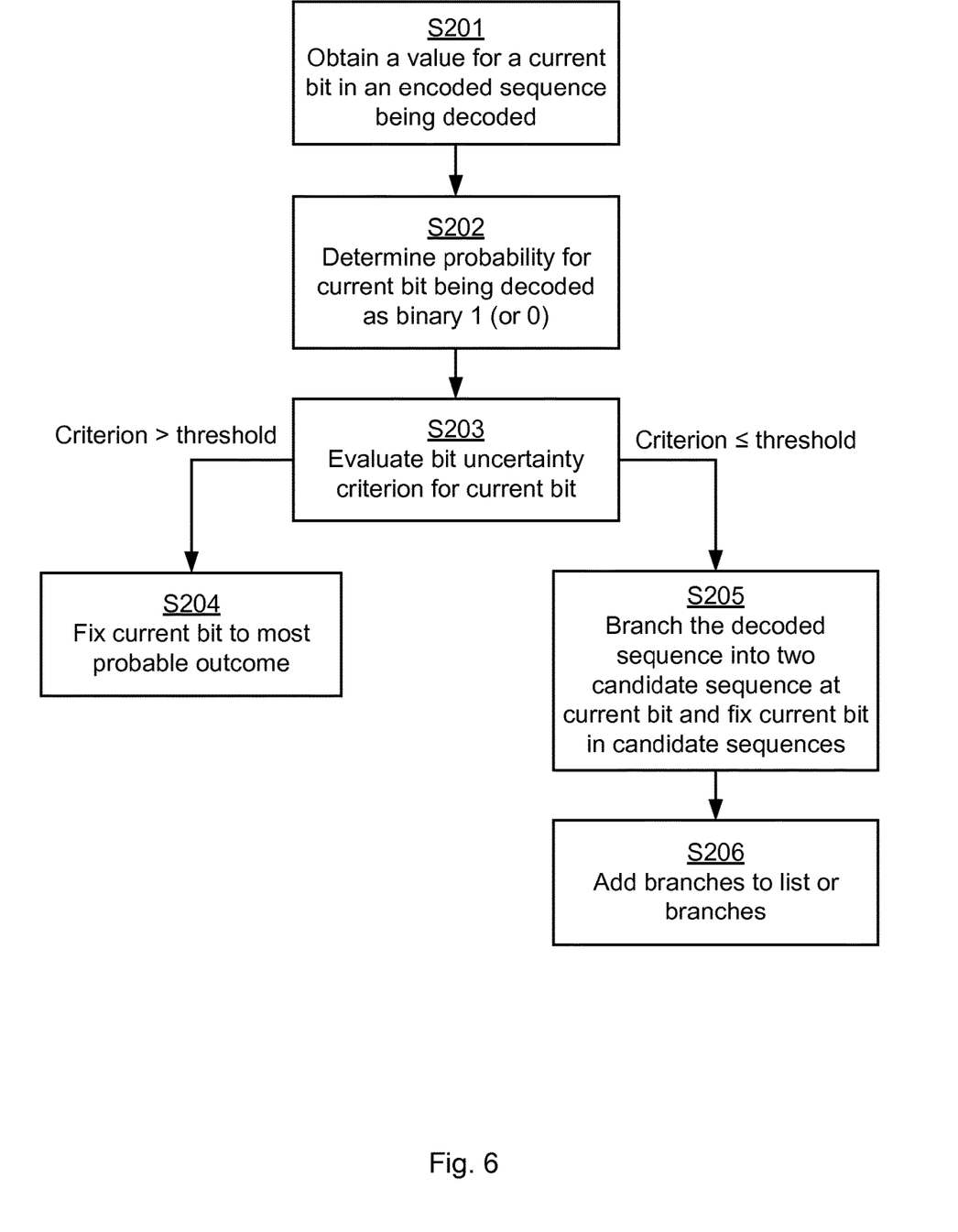

FIGS. 4, 5, and 6 are flow charts illustrating embodiments of methods for decoding an encoded sequence $\hat{y}$ into a decoded sequence $\hat{z}$. The methods are performed by the information decoder 200. The methods are advantageously provided as computer programs.

Reference is now made to FIG. 4 illustrating a method for decoding an encoded sequence $\hat{y}$ into a decoded sequence $\hat{z}$ as performed by the information decoder 200 according to an embodiment.

S102: The information decoder 200 obtains the encoded sequence $\hat{y}$. The encoded sequence $\hat{y}$ has been encoded using a polar code.

S104: The information decoder 200 successively decodes the encoded sequence $\hat{y}$ into the decoded sequence $\hat{z}$.

The successive decoding is based on using a criterion that depends on the instantaneous channel realizations, to expand a list of candidate decoded sequences with a new candidate candidate decoded sequence. Successively decoding the encoded sequence $\hat{y}$ into the decoded sequence $\hat{z}$ therefore involves the information decoder 200 to be configured to perform steps S106 and S108:

S106: The information decoder 200 performs a threshold check of at least some successive binary digits in a sequence of the encoded sequence $\hat{y}$ that is being decoded. The threshold check evaluates a bit uncertainty criterion of these at least some successive binary digits. Exemplary embodiments of such bit uncertainty criterions will be disclosed below.

S108: The information decoder 200 branches the decoded sequence into two candidate decoded sequences whenever the threshold check fails.

The branching is thus based on a threshold check using an uncertainty mapping that depends on the instantaneous channel realization This method differs from aforementioned US2015/0026543 A1 in the way the decision is made whether to branch the decoded sequence. In US2015/0026543 A1, the decoded sequence is branched based on a predetermined set of bit indices. This list is designed when the polar code is designed and does not change for different channel realizations. From a channel perspective the list thus appears as deterministic. A typical list is based on the most reliable bit indices in terms of mutual information (or entropy). Mutual information is an averaged measure over a distribution of channel realizations. According to the herein disclosed method, the decoded sequence is branched based on a threshold check using an uncertainty mapping that depends on the instantaneous channel realization.

This method differs also from the aforementioned paper "List decoding of polar codes" in the way the decision is made whether to branch the decoded sequence. In "List decoding of polar codes", all possible decoded sequence are expanded fully (i.e., all binary digits are branched) until a limited list-size has been reached. This branching is then followed by a pruning criterion in order to remove the least likely decoded sequence in the remaining decoding steps in order to keep the list-size feasible. According to the herein disclosed method, the decoding procedure involves the opposite, namely not all decoded binary digits are branched and no decoded sequences are pruned.

Instead, only specific decoded sequences are chosen (by means of only selected binary digits being branched).

As mentioned above, the information decoder 200 in step S108 branches the decoded sequence into two candidate decoded sequences whenever the threshold check fails. In this respect, no branching is performed when the whenever the threshold check is successful. When the threshold check is successful the binary digits in the sequence of the encoded sequence $\hat{y}$ that is being decoded are decoded into one decoded sequence $\hat{z}$, without any branching thereof.

The herein disclosed methods for decoding the encoded sequence $\hat{y}$ into the decoded sequence $\hat{z}$ can thus use a dynamic list expansion procedure when decoding a polar code with the possibility to have several instances (each defined by a candidate decoded sequence) of the polar code decoding problem. The candidate decoded sequences are found by successive decoding of the encoded sequence. Following the polar code bit-order, the successive decoding will decode the first bit, which means that it will set the most likely value of that bit (binary 0 or 1) as the true decoded value. This information will then be propagated throughout the structure of the polar code (updating the probabilities in the remaining binary digits), before the next bit in the order, i.e., the second bit is decoded. This decoding procedure be repeated until all the remaining binary digits are decoded. According to the herein disclosed methods, a bit, that does not have a distinct probability of being either 0 or 1, will be set to both values and thus two separate candidate decoded sequences will be created from the encoded sequence that is being decoded, one with that binary digit being set to 0 and another with the same binary digit set to 1.

Embodiments relating to further details of decoding an encoded sequence ŷ into a decoded sequence ẑ as performed by the information decoder 200 will now be disclosed.

There may be different causes of the branching. For example, according to an embodiment the branching is caused by a binary digit of the at least some successive binary digits for which the threshold check fails has an equal probability of being decoded into a zero and a one during the successive decoding of the encoded sequence. In this respect the term equal probability can be defined as a probability value of decoding a binary digit to a one being in the interval 0.35-0.65, preferably in the interval 0.4-0.6, more preferably in the interval 0.45-0.55.

There may be different ways to form the candidate decoded sequences when performing the branching. For example, according to an embodiment the branching causes a binary digit of the at least some successive binary digits for which the threshold check fails to be set to binary 0 in a first of the two candidate decoded sequences and set to binary 1 in a second of the two candidate decoded sequences.

That is, some binary digits that the information decoder 200 decides to be uncertain (for instance if the probability of a given binary digit being binary 1 is close to 0.5, then the information decoder 200 cannot be certain that the value of this given binary digit is binary 0 or binary 1) can be branched into two decoding instances: one candidate decoded sequence where this given binary digit is set to binary 0 and one candidate decoded sequence where this given binary digit is set to binary 1.

Reference is now made to FIG. 5 illustrating methods for decoding an encoded sequence ŷ into a decoded sequence ẑ as performed by the information decoder 200 according to further embodiments. It is assumed that steps S102, S104, S106, and S108 are performed as disclosed above and a thus repeated description thereof is therefore omitted.

There may be different ways to perform the threshold check in step S106. Different embodiments relating thereto will now be described in turn. For example, estimated probabilities can be acquired during the successive decoding of the polar code. Hence, according to an embodiment the information decoder 200 is configured to perform step S106a as part of performing the threshold check in step S106:

S106a: The information decoder 200 determines one probability value for each of the at least some successive binary digits.

The bit uncertainty criterion for a given binary digit of said at least some successive binary digits can then be evaluated using this one probability value for this given binary digit.

The branching can be based on various uncertainty metrics of the binary digits that are being decoded. There can thus be different ways to evaluate the bit uncertainty criterion for this given binary digit. For example, the uncertainty criterion can be evaluated using a log-likelihood ratio, entropy, sell-information, or probability measure. Hence, according to an embodiment the information decoder 200 is configured to perform step S106b as part of performing the threshold check in step S106 in order to evaluate the bit uncertainty criterion for this given binary digit:

S106b: The information decoder 200 determines at least one of a log-likelihood ratio, entropy, sell-information, or probability measure using the probability value of this given binary digit. The threshold check then fails whenever the absolute value of the log-likelihood ratio, the entropy, the self-information, or the probability measure is lower than a threshold. Examples of such thresholds will be disclosed next.

For instance, the log-likelihood ratio value $LLR_i$ of a given binary digit at index i represents the certainty of that given binary digit being a binary 0 or a binary 1. If the log-likelihood ratio value is close to zero, which is an indication that the threshold check fails, branching is performed at this given binary digit. Further examples of threshold checks are:

$|LLR_i| \lessgtr \eta$, where $LLR_i$ is the log-likelihood ratio value of the binary digit at index i, where the log-likelihood ratio value are determined $H_i \lessgtr \mu$, where $H_i$ is the entropy value of the binary digit at index i, $I_i \lessgtr \upsilon$, where $I_i$ is the sell-information value of the binary digit at index i.

Here, the notation $\lessgtr$ means that a decision is taken based on a comparison with a threshold. Denote by $p_i$ the probability of the binary digit at index i being decoded into binary 1. The log-likelihood ratio values could then be determined from the estimated probabilities that are acquired in the successive decoding of the polar code, i.e., $$LLR_i = \log\left(\frac{p_i}{1-p_i}\right).$$

The entropy value can be determined assuming a binary symmetric channel, i.e., $H_i = -p_i \log_2 p_i - (1-p_i) \log_2(1-p_i)$. The sell-information can be determined as $I_i = 1 - H_i$.

After the successive decoding in steps S104, S106, S108 has been completed, the information decoder 200 can be configured to run through a number of parallel decoding instances and select the candidate decoded sequence which has the highest probability of being correct (by for instance accumulating the probabilities over the binary digits in that candidate decoded sequence). Hence, according to an embodiment the information decoder 200 is configured to perform steps S110 and S112 after having performed step S108:

S110: The information decoder 200 repeats the successively decoding (in steps S104, S106, S108) until all binary digits of the encoded sequence have been decoded. This results in at least two candidate decoded sequences.

S112: The information decoder 200 discards all but one of the at least two candidate decoded sequences, resulting in one single decoded sequence.

After the list decoding is performed, the information decoder 200 can thereby select the candidate sequence which has the highest probability of being correct. Two embodiments relating to how the information decoder 200 can discard all but one of the at least two candidate decoded sequences will now be disclosed.

According to a first embodiment the information decoder accumulates the probabilities over the binary digits in the candidate decoded sequences. According to this embodiment the information decoder 200 is configured to discard all but one of the at least two candidate decoded sequences in step S112 by performing step S112a:

S112a: The information decoder 200 selects as the one single decoded sequence that candidate decoded sequences of the at least two candidate decoded sequences that has highest accumulated probability values.

Step S112a represents a stand-alone technique that only uses the information in the information decoder 200. Another way is to perform a cyclic redundancy check at the end. This can be an even more confident way of picking a single candidate decoded sequence amongst a plurality of candidate decoded sequences. Hence, according to a second embodiment the information decoder 200 is configured to discard all but one of the at least two candidate decoded sequences in step S112 by performing step S112b and step S112c:

S112b: The information decoder 200 performs a respective cyclic redundancy check for each of the at least two candidate decoded sequences.

S112c: The information decoder 200 selects as the one single decoded sequence that candidate decoded sequences of the at least two candidate decoded sequences that passes its cyclic redundancy check.

Although it has above been disclosed that the threshold check is performed for at least some of the successive binary digits in the sequence of the encoded sequence that is being decoded, the threshold check can be performed for all these successive binary digits. Hence, according to an embodiment the threshold check in step S106 is performed for each successive binary digit in the sequence of the encoded sequence that is being decoded.

Reference is now made to FIG. 6 illustrating methods for decoding an encoded sequence ŷ into a decoded sequence ẑ as performed by the information decoder 200 according to one particular embodiment based on at least some of the above disclosed embodiments.

S201: The information decoder 300 obtains a value for a current binary digit in the encoded sequence being decoded. One way to implement step S201 is to perform step S102.

S202: The information decoder 300 determines a probability value $p_i$ for the binary digit at index i being decoded into binary 1 (or the probability $1-p_i$ for the binary digit at index i being decoded into binary 0). One way to implement step S202 is to perform step S106a as part of step S106.

S203: The information decoder 300 evaluates a bit uncertainty criterion for the binary digit at index i being decoded into binary 1 (or binary 0). One way to implement step S203 is to perform step S106b as part of step S106.

S204: The information decoder 300, if the evaluation of the bit uncertainty criterion is successful, fixes the binary digit at index i being decoded into its most probable value (i.e., binary 0 or binary 1, depending on the value of $p_i$).

S205: The information decoder 300, if the evaluation of the bit uncertainty criterion fails, branches the decoded sequence into two candidate decoded sequence at the binary digit at index i. Further, the information decoder 300 fixes the binary digit at index i to have binary value 0 in one of the two candidate decoded sequences and binary value 1 in the other of the two decoded candidate decoded sequences. One way to implement step S205 is to perform step S108.

Each branching during the successive decoding thus creates a list of candidate decoded sequences where each branched bit effectively results in a pair of candidate decoded sequences where the branched bit is fixed to binary 0 in one candidate decoded sequence and to binary 1 in the other candidate decoded sequence.

S206: The information decoder 300 adds the two candidate sequences to a list of candidate decoded sequences.

Steps S201-S206 are repeated until the entire encoded sequence has been decoded, as in step S110.

Any of above disclosed steps S112, S112a, S112b, S112c can then be performed in order to select a single decoded sequence.

Figure 7:
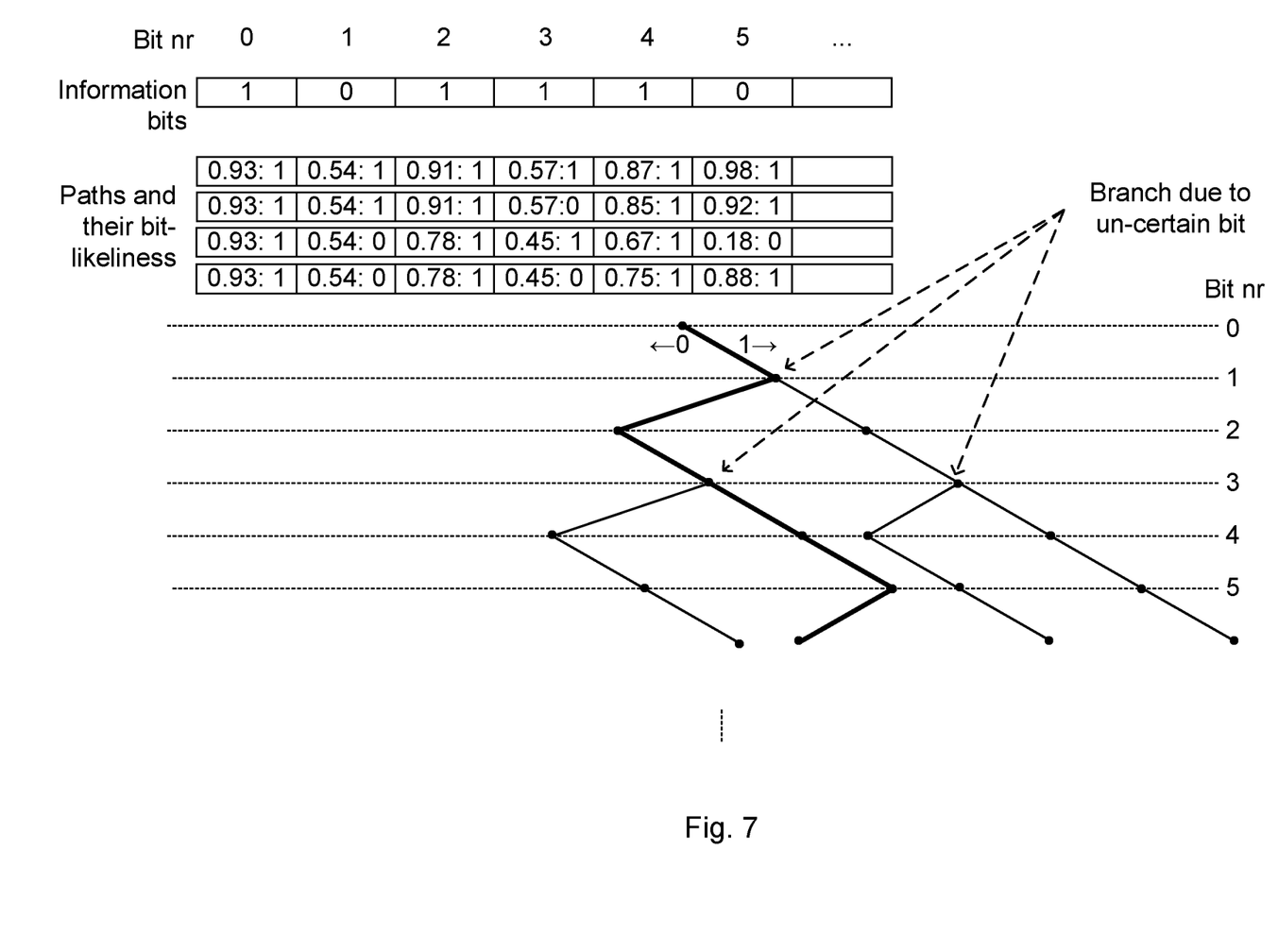
FIGS. 7 and 8 are schematic diagrams illustrating list decoding according to embodiments.

FIG. 7 illustrates an example of list decoding of a polar code with a list that has reached a size of 4. In this example, the probabilities show the evaluated likelihoods of each bit being equal to 1. Any bit whose probability is between 0.5±0.2 is said to be uncertain in this example and hence is branched out. This has resulted in four different paths. In the example of FIG. 7 only the third path indicates a 0 at bit five (the probability of decoding bit 5 as a 1 is 0.18 and hence bit 5 is decoded as 0) and hence this path is selected as the correct decoded sequence.

Figure 8:
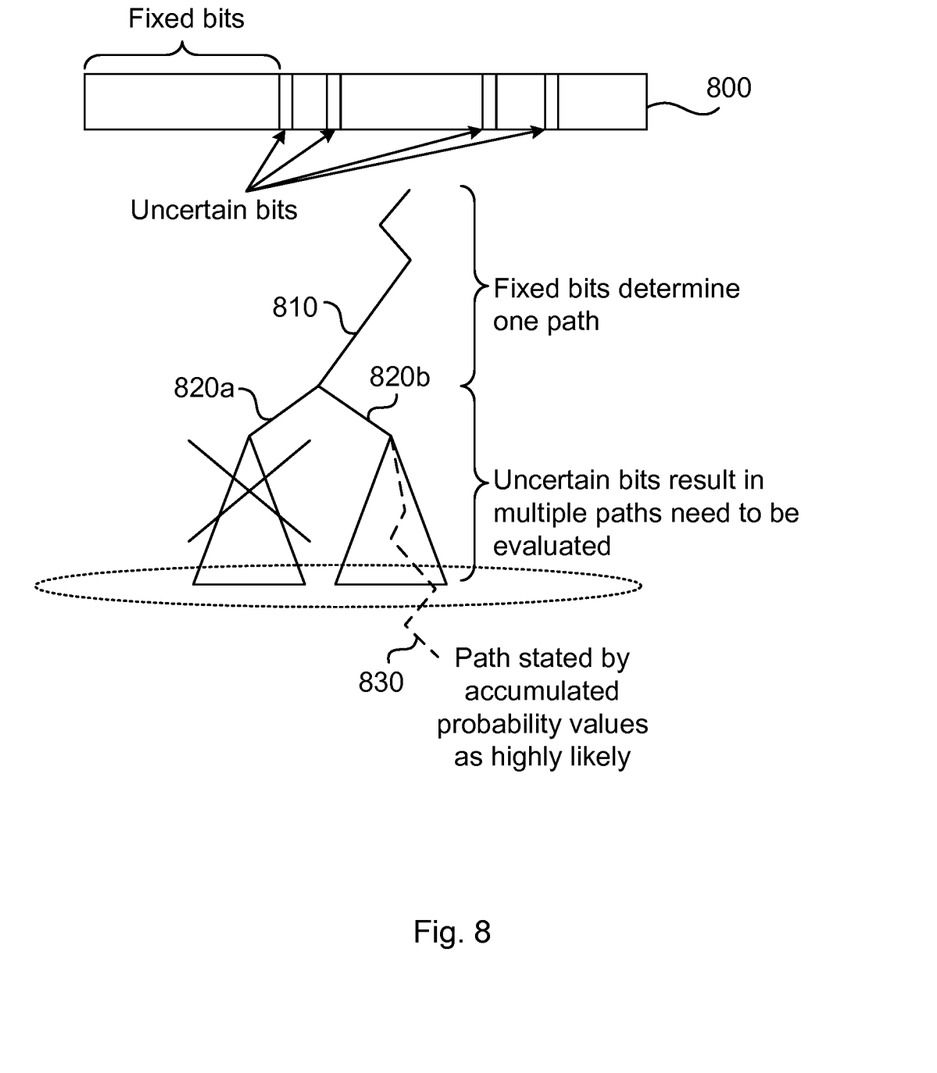

FIG. 8 shows a more general illustration of list decoding of a polar code wherein a sequence of uncertain binary digits may result in sub-trees of candidate decoded sequences. In more detail, FIG. 8 at 800 illustrates a sequence of the encoded sequence that is being decoded. For some of the binary digits the threshold check is successful and these binary digits are identified as fixed bits. A successive sequence of such fixed bits define one path 810. For some of the binary digits the threshold check fails and these binary digits are identified as uncertain bits. For each failure of the threshold check a branching of the decoded sequence into two candidate decoded sequences is performed, resulting in multiple paths 820a, 820b for the uncertain bits needed to be evaluated. At the end of the decoding, one path 830 of the multiple paths 820a, 820b is selected, based on having accumulated probability values as highly likely (in comparison to all other candidate decoded sequences), to represent the decoded sequence.

Figure 9:
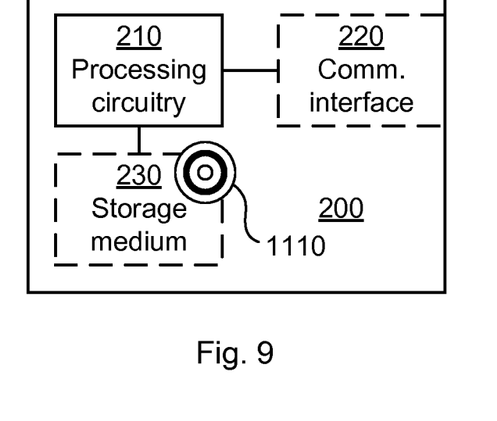
FIG. 9 is a schematic diagram showing functional units of an information decoder according to an embodiment.

FIG. 9 schematically illustrates, in terms of a number of functional units, the components of an information decoder 200 according to an embodiment.

Processing circuitry 210 is provided using any combination of one or more of a suitable central processing unit (CPU), multiprocessor, microcontroller, digital signal processor (DSP), etc., capable of executing software instructions stored in a computer program product 1110 (as in FIG. 11), e.g. in the form of a storage medium 230. The processing circuitry 210 may further be provided as at least one application specific integrated circuit (ASIC), or field programmable gate array (FPGA).

Particularly, the processing circuitry 210 is configured to cause the information decoder 200 to perform a set of operations, or steps, S102-S112, as disclosed above. For example, the storage medium 230 may store the set of operations, and the processing circuitry 210 may be configured to retrieve the set of operations from the storage medium 230 to cause the information decoder 200 to perform the set of operations. The set of operations may be provided as a set of executable instructions.

Thus the processing circuitry 210 is thereby arranged to execute methods as herein disclosed. The storage medium 230 may also comprise persistent storage, which, for example, can be any single one or combination of magnetic memory, optical memory, solid state memory or even remotely mounted memory. The information decoder 200 may further comprise a communications interface 220 at least configured for communications with an information encoder 110. As such the communications interface 220 may comprise one or more transmitters and receivers, comprising analogue and digital components. The processing circuitry 210 controls the general operation of the information decoder 200 e.g. by sending data and control signals to the communications interface 220 and the storage medium 230, by receiving data and reports from the communications interface 220, and by retrieving data and instructions from the storage medium 230. Other components, as well as the related functionality, of the information decoder 200 are omitted in order not to obscure the concepts presented herein.

Figure 10:
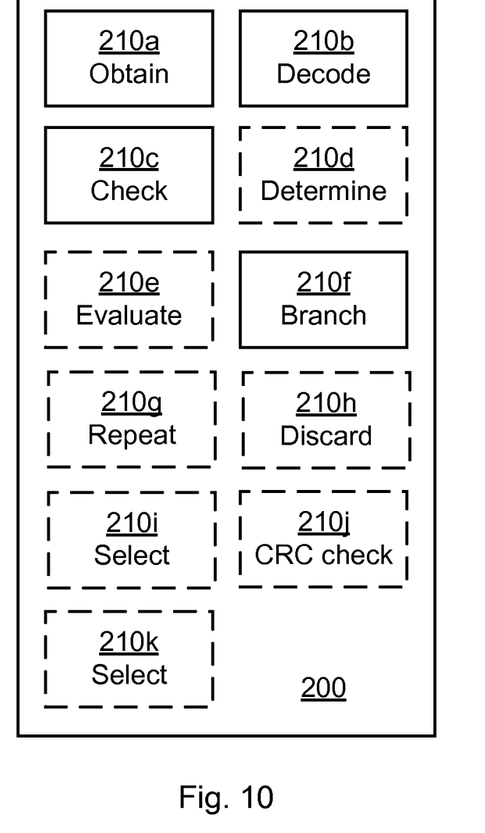
FIG. 10 is a schematic diagram showing functional modules of an information decoder according to an embodiment.

FIG. 10 schematically illustrates, in terms of a number of functional modules, the components of an information decoder 200 according to an embodiment.

The information decoder 200 of FIG. 10 comprises a number of functional modules; an obtain module 210*a* configured to perform step S102, a decode module 210*b* configured to perform step S104, a check module 210*c* configured to perform step S106, and a branch module 210*f* configured to perform step S108.

The information decoder 200 of FIG. 10 may further comprises a number of optional functional modules, such as any of a determine module 210*d* configured to perform step S106*a*, an evaluate module 210*e* configured to perform step S106*b*, a repeat module 210*g* configured to perform step S110, a discard module 210*h* configured to perform step S112, a select module 210*i* configured to perform step S112*a*, a cyclic redundancy check (CRC) module 210*j* configured to perform step S112*b*, and a select module 210*k* configured to perform step S112*c*.

In general terms, each functional module 210*a*-210*k* may in one embodiment be implemented only in hardware or and in another embodiment with the help of software, i.e., the latter embodiment having computer program instructions stored on the storage medium 230 which when run on the processing circuitry makes the information decoder 200 perform the corresponding steps mentioned above in conjunction with FIG. 10. It should also be mentioned that even though the modules correspond to parts of a computer program, they do not need to be separate modules therein, but the way in which they are implemented in software is dependent on the programming language used. Preferably, one or more or all functional modules 210*a*-210*k* may be implemented by the processing circuitry 210, possibly in cooperation with functional units 220 and/or 230. The processing circuitry 210 may thus be configured to from the storage medium 230 fetch instructions as provided by a functional module 210*a*-210*k* and to execute these instructions, thereby performing any steps as disclosed herein.

The information decoder 200 may be provided as a standalone device or as a part of at least one further device. For example, the information decoder 200 may be provided in a radio access network node (such as in a radio base station, a base transceiver station, a node B, or an evolved node B) or in an end-user device (such as in a portable wireless device, a mobile station, a mobile phone, a handset, a wireless local loop phone, a user equipment (UE), a smartphone, a laptop computer, a tablet computer, a sensor device, an Internet of Things device, or a wireless modem).

Thus, a first portion of the instructions performed by the information decoder 200 may be executed in a first device, and a second portion of the of the instructions performed by the information decoder 200 may be executed in a second device; the herein disclosed embodiments are not limited to any particular number of devices on which the instructions performed by the information decoder 200 may be executed. Hence, the methods according to the herein disclosed embodiments are suitable to be performed by a information decoder 200 residing in a cloud computational environment. Therefore, although a single processing circuitry 210 is illustrated in FIG. 9 the processing circuitry 210 may be distributed among a plurality of devices, or nodes. The same applies to the functional modules 210*a*-210*k* of FIG. 10 and the computer program 1120 of FIG. 11 (see below).

Figure 11:
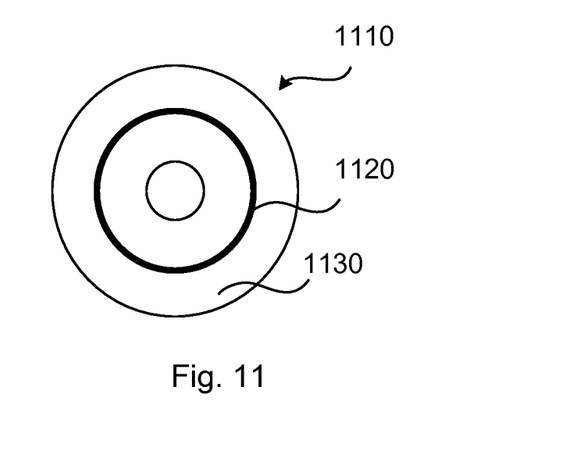
FIG. 11 shows one example of a computer program product comprising computer readable means according to an embodiment.

FIG. 11 shows one example of a computer program product 1110 comprising computer readable storage medium 1130. On this computer readable storage medium 1130, a computer program 1120 can be stored, which computer program 1120 can cause the processing circuitry 210 and thereto operatively coupled entities and devices, such as the communications interface 220 and the storage medium 230, to execute methods according to embodiments described herein. The computer program 1120 and/or computer program product 1110 may thus provide means for performing any steps as herein disclosed.

In the example of FIG. 11, the computer program product 1110 is illustrated as an optical disc, such as a CD (compact disc) or a DVD (digital versatile disc) or a Blu-Ray disc. The computer program product 1110 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 1120 is here schematically shown as a track on the depicted optical disk, the computer program 1120 can be stored in any way which is suitable for the computer program product 1110.

The inventive concept has mainly been described above with reference to a few embodiments. However, as is readily appreciated by a person skilled in the art, other embodiments than the ones disclosed above are equally possible within the scope of the inventive concept, as defined by the appended patent claims. Or example, although the above disclosed polar codes have been described as being binary valued, it is foreseen that the herein disclosed embodiments could be applied to decoding of non-binary valued polar codes, for example by determining multi-dimensional log-likelihoods (or other uncertainty criterions) for arbitrary non-binary alphabets.

The invention claimed is:

1. A method for decoding an encoded sequence into a decoded sequence, the method comprising an information decoder:
    obtaining the encoded sequence, the encoded sequence having been encoded using a polar code; and
    successively decoding the encoded sequence into the decoded sequence, by:
        performing a threshold check of at least some successive binary digits in a sequence of the encoded sequence that is being decoded, the threshold check evaluating a bit uncertainty criterion of the at least some successive binary digits; and
        branching the decoded sequence into two candidate decoded sequences whenever the threshold check fails.

2. The method of claim 1, wherein performing the threshold check comprises determining one probability value for each one of the at least some successive binary digits.

3. The method of claim 2, wherein the bit uncertainty criterion for a given binary digit of the at least some successive binary digits is evaluated using the one probability value for the given binary digit.

4. The method of claim 3:
wherein evaluating the bit uncertainty criterion for the given binary digit comprises determining at least one of a log-likelihood ratio, entropy, self-information, or probability measure using the probability value of the given binary digit; and
wherein the threshold check fails whenever the log-likelihood ratio, entropy, self-information, or probability measure is lower than a threshold.

5. The method of claim 2:
further comprising repeating the successively decoding until all binary digits of the encoded sequence have been decoded, resulting in at least two candidate decoded sequences;
further comprising discarding all but one of the at least two candidate decoded sequences, resulting in one single decoded sequence;
wherein the discarding comprises selecting as the one single decoded sequence a candidate decoded sequence of the at least two candidate decoded sequences having highest accumulated probability values.

6. The method of claim 2:
further comprising repeating the successively decoding until all binary digits of the encoded sequence have been decoded, resulting in at least two candidate decoded sequences;
further comprising discarding all but one of the at least two candidate decoded sequences, resulting in one single decoded sequence;
wherein the discarding comprises:
performing a respective cyclic redundancy check for each of the at least two candidate decoded sequences; and
selecting as the one single decoded sequence a candidate decoded sequence of the at least two candidate decoded sequences that passes its cyclic redundancy check.

7. The method of claim 1, further comprising:
repeating the successively decoding until all binary digits of the encoded sequence have been decoded, resulting in at least two candidate decoded sequences; and
discarding all but one of the at least two candidate decoded sequences, resulting in one single decoded sequence.

8. The method of claim 1, wherein the branching is caused by a binary digit of the at least some successive binary digits for which the threshold check fails having an equal probability of being decoded into a zero and a one during the successive decoding of the encoded sequence.

9. The method of claim 1, wherein the branching causes a binary digit of the at least some successive binary digits for which the threshold check fails to be set to binary 0 in a first of the two candidate decoded sequences and set to binary 1 in a second of the two candidate decoded sequences.

10. The method of claim 1, wherein the threshold check is performed for each successive binary digit in the sequence of the encoded sequence that is being decoded.

11. An information decoder for decoding an encoded sequence into a decoded sequence, the information decoder comprising:
processing circuitry;
memory containing instructions executable by the processing circuitry whereby the information decoder is operative to:
obtain the encoded sequence, the encoded sequence having been encoded using a polar code; and
successively decode the encoded sequence into the decoded sequence by:
performing a threshold check of at least some successive binary digits in a sequence of the encoded sequence that is being decoded, the threshold check evaluating a bit uncertainty criterion of the at least some successive binary digits; and
branching the decoded sequence into two candidate decoded sequences whenever the threshold check fails.

12. The information decoder of claim 11, wherein performing the threshold check comprises determining one probability value for each one of the at least some successive binary digits.

13. The information decoder of claim 12, wherein the bit uncertainty criterion for a given binary digit of the at least some successive binary digits is evaluated using the one probability value for the given binary digit.

14. The information decoder of claim 13:
wherein evaluating the bit uncertainty criterion for the given binary digit comprises determining at least one of a log-likelihood ratio, entropy, self-information, or probability measure using the probability value of the given binary digit; and
wherein the threshold check fails whenever the log-likelihood ratio, entropy, self-information, or probability measure is lower than a threshold.

15. The information decoder of claim 12:
wherein the instructions are such that the information decoder is operative to:
repeat the successively decoding until all binary digits of the encoded sequence have been decoded, resulting in at least two candidate decoded sequences;
discard all but one of the at least two candidate decoded sequences, resulting in one single decoded sequence; and
wherein the discarding comprises selecting as the one single decoded sequence a candidate decoded sequence of the at least two candidate decoded sequences having highest accumulated probability values.

16. The information decoder of claim 12:
wherein the instructions are such that the information decoder is operative to:
repeat the successively decoding until all binary digits of the encoded sequence have been decoded, resulting in at least two candidate decoded sequences;
discard all but one of the at least two candidate decoded sequences, resulting in one single decoded sequence; and
wherein the discarding comprises:
performing a respective cyclic redundancy check for each of the at least two candidate decoded sequences; and
selecting as the one single decoded sequence a candidate decoded sequence of the at least two candidate decoded sequences that passes its cyclic redundancy check.

17. The information decoder of claim 11, wherein the instructions are such that the information decoder is operative to:
repeat the successively decoding until all binary digits of the encoded sequence have been decoded, resulting in at least two candidate decoded sequences; and
discard all but one of the at least two candidate decoded sequences, resulting in one single decoded sequence.

18. The information decoder of claim 11, wherein the branching is caused by a binary digit of the at least some successive binary digits for which the threshold check fails having an equal probability of being decoded into a zero and a one during the successive decoding of the encoded sequence.

19. The information decoder of claim 11, wherein the branching causes a binary digit of the at least some successive binary digits for which the threshold check fails to be set to binary 0 in a first of the two candidate decoded sequences and set to binary 1 in a second of the two candidate decoded sequences.

20. A non-transitory computer readable recording medium storing a computer program product for decoding an encoded sequence into a decoded sequence, the computer program product comprising software instructions which, when run on processing circuitry of an information decoder, causes the information decoder to:
  obtain the encoded sequence, the encoded sequence having been encoded using a polar code; and
  successively decode the encoded sequence into the decoded sequence by:
    performing a threshold check of at least some successive binary digits in a sequence of the encoded sequence that is being decoded, the threshold check evaluating a bit uncertainty criterion of the at least some successive binary digits; and
    branching the decoded sequence into two candidate decoded sequences whenever the threshold check fails.

* * * * *